(12) United States Patent
Hu

(10) Patent No.: US 11,646,363 B2
(45) Date of Patent: *May 9, 2023

(54) METHODS OF FORMING NAND CELL UNITS

(71) Applicant: Micron Technology, Inc., Boise, ID (US)

(72) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

This patent is subject to a terminal disclaimer.

(21) Appl. No.: 17/206,324

(22) Filed: Mar. 19, 2021

(65) Prior Publication Data

US 2021/0210623 A1    Jul. 8, 2021

Related U.S. Application Data

(60) Continuation of application No. 16/548,003, filed on Aug. 22, 2019, now Pat. No. 10,971,607, which is a
(Continued)

(51) Int. Cl.
*H01L 29/66* (2006.01)
*H01L 21/28* (2006.01)
(Continued)

(52) U.S. Cl.
CPC ...... *H01L 29/66833* (2013.01); *H01L 27/115* (2013.01); *H01L 27/1157* (2013.01); *H01L 27/11521* (2013.01); *H01L 27/11524* (2013.01); *H01L 29/40114* (2019.08); *H01L 29/40117* (2019.08); *H01L 29/4234* (2013.01); *H01L 29/66825* (2013.01); *H01L 29/792* (2013.01)

(58) Field of Classification Search
CPC ......... H01L 29/66833; H01L 29/40114; H01L 29/40117; H01L 29/4234; H01L 29/66825; H01L 29/792; H01L 27/115; H01L 27/11521; H01L 27/11524; H01L 27/1157
See application file for complete search history.

(56) References Cited

U.S. PATENT DOCUMENTS 5,158,902 A   10/1992   Hanada
5,981,340 A   11/1999   Chang et al.
(Continued)

*Primary Examiner* — Shahed Ahmed
*Assistant Examiner* — Vicki B. Booker
(74) *Attorney, Agent, or Firm* — Wells St. John P.S

(57) ABSTRACT

Some embodiments include methods of forming charge storage transistor gates and standard FET gates in which common processing is utilized for fabrication of at least some portions of the different types of gates. FET and charge storage transistor gate stacks may be formed. The gate stacks may each include a gate material, an insulative material, and a sacrificial material. The sacrificial material is removed from the FET and charge storage transistor gate stacks. The insulative material of the FET gate stacks is etched through. A conductive material is formed over the FET gate stacks and over the charge storage transistor gate stacks. The conductive material physically contacts the gate material of the FET gate stacks, and is separated from the gate material of the charge storage transistor gate stacks by the insulative material remaining in the charge storage transistor gate stacks. Some embodiments include gate structures.

20 Claims, 11 Drawing Sheets

Related U.S. Application Data continuation of application No. 15/967,457, filed on Apr. 30, 2018, now Pat. No. 10,529,834, which is a division of application No. 15/207,275, filed on Jul. 11, 2016, now Pat. No. 9,960,258, which is a division of application No. 14/225,053, filed on Mar. 25, 2014, now Pat. No. 9,396,952, which is a division of application No. 13/605,848, filed on Sep. 6, 2012, now Pat. No. 8,716,119, which is a division of application No. 12/986,487, filed on Jan. 7, 2011, now Pat. No. 8,288,817, which is a division of application No. 12/128,404, filed on May 28, 2008, now Pat. No. 7,867,844.

(51) Int. Cl.
*H01L 27/11521* (2017.01)
*H01L 27/11524* (2017.01)
*H01L 29/423* (2006.01)
*H01L 29/792* (2006.01)
*H01L 27/115* (2017.01)
*H01L 27/1157* (2017.01)

(56) References Cited

U.S. PATENT DOCUMENTS

| | | | |
|---|---|---|---|
| 6,235,586 | B1 | 5/2001 | Au et al. |
| 6,239,500 | B1 | 5/2001 | Sugimachi |
| 6,337,245 | B1 | 1/2002 | Choi |
| 7,348,236 | B2 | 3/2008 | Abbott et al. |
| 7,829,938 | B2 | 11/2010 | Bhattacharyya |
| 2006/0278917 | A1 | 12/2006 | Forbes et al. |
| 2007/0037350 | A1* | 2/2007 | Woo ............. H01L 27/115 438/257 |
| 2007/0105306 | A1 | 5/2007 | Prinz et al. |

* cited by examiner

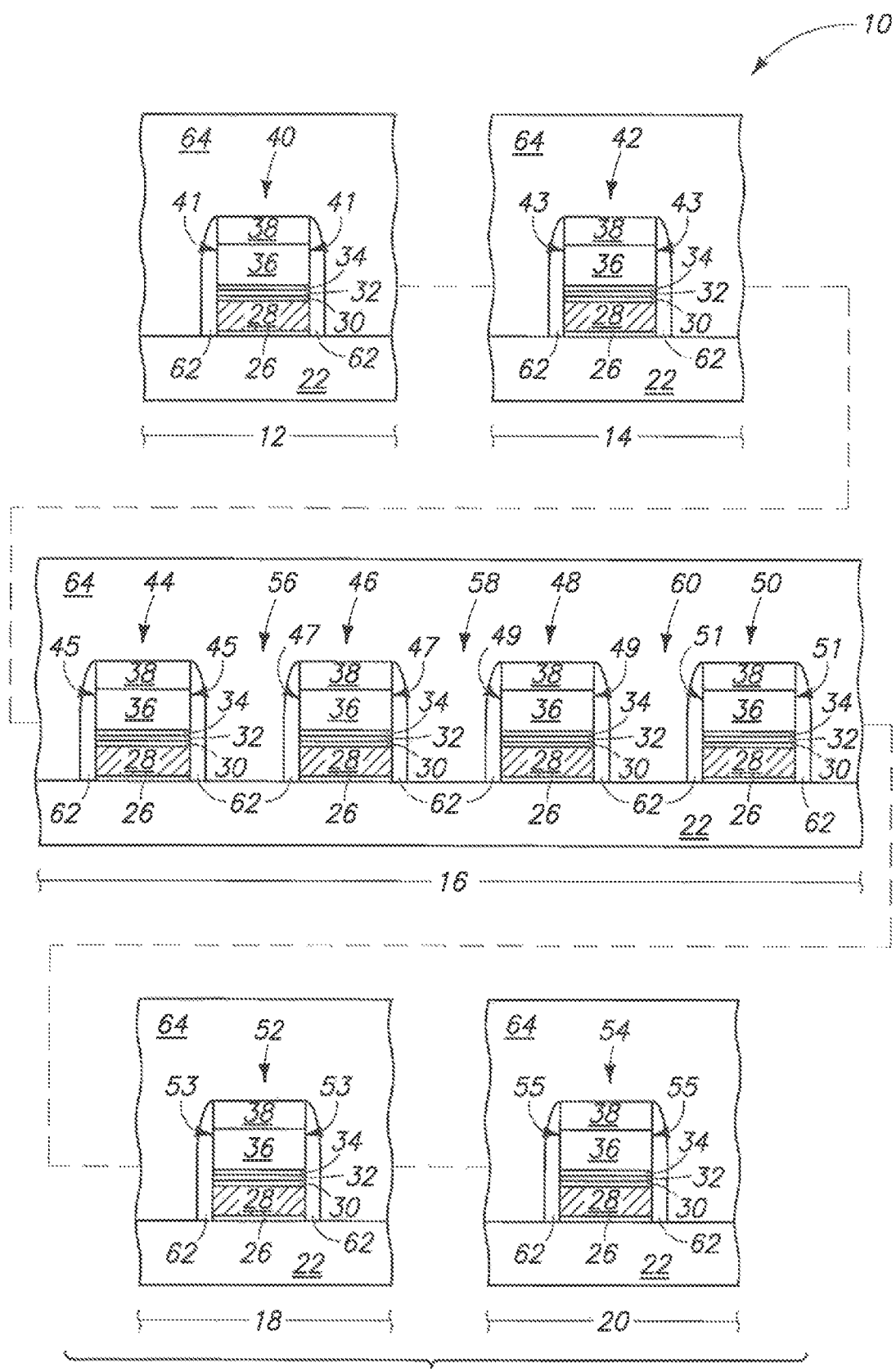

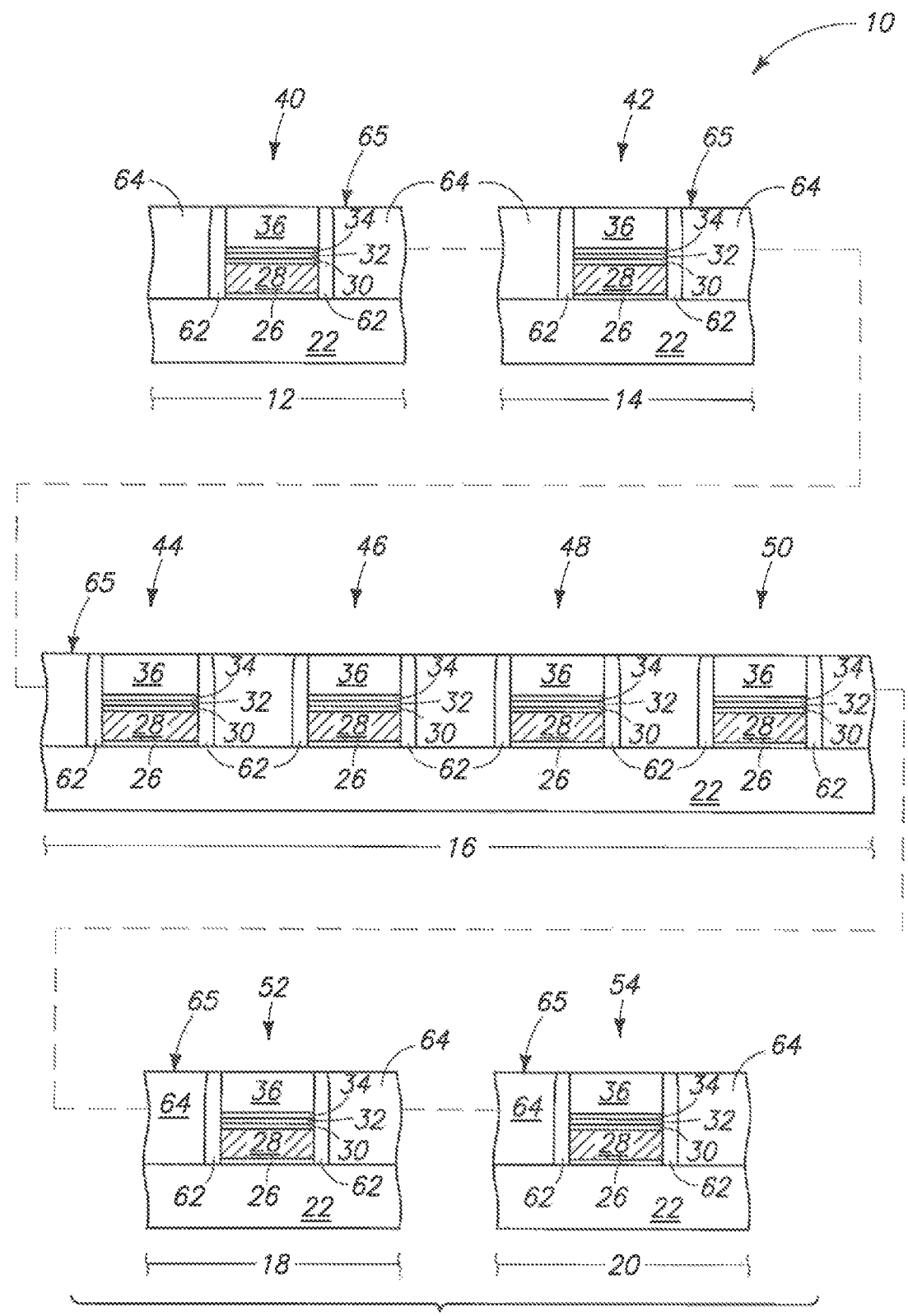

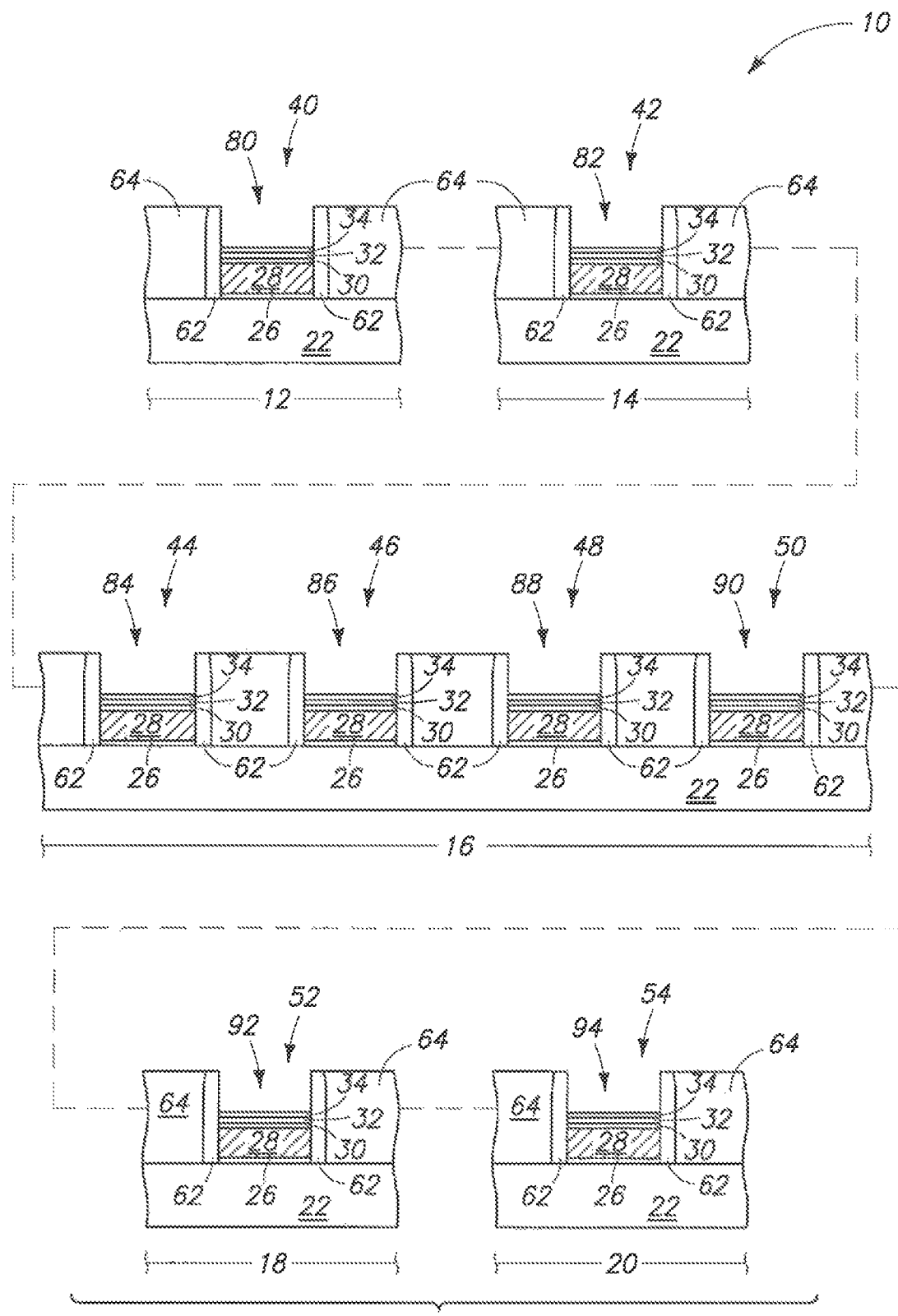

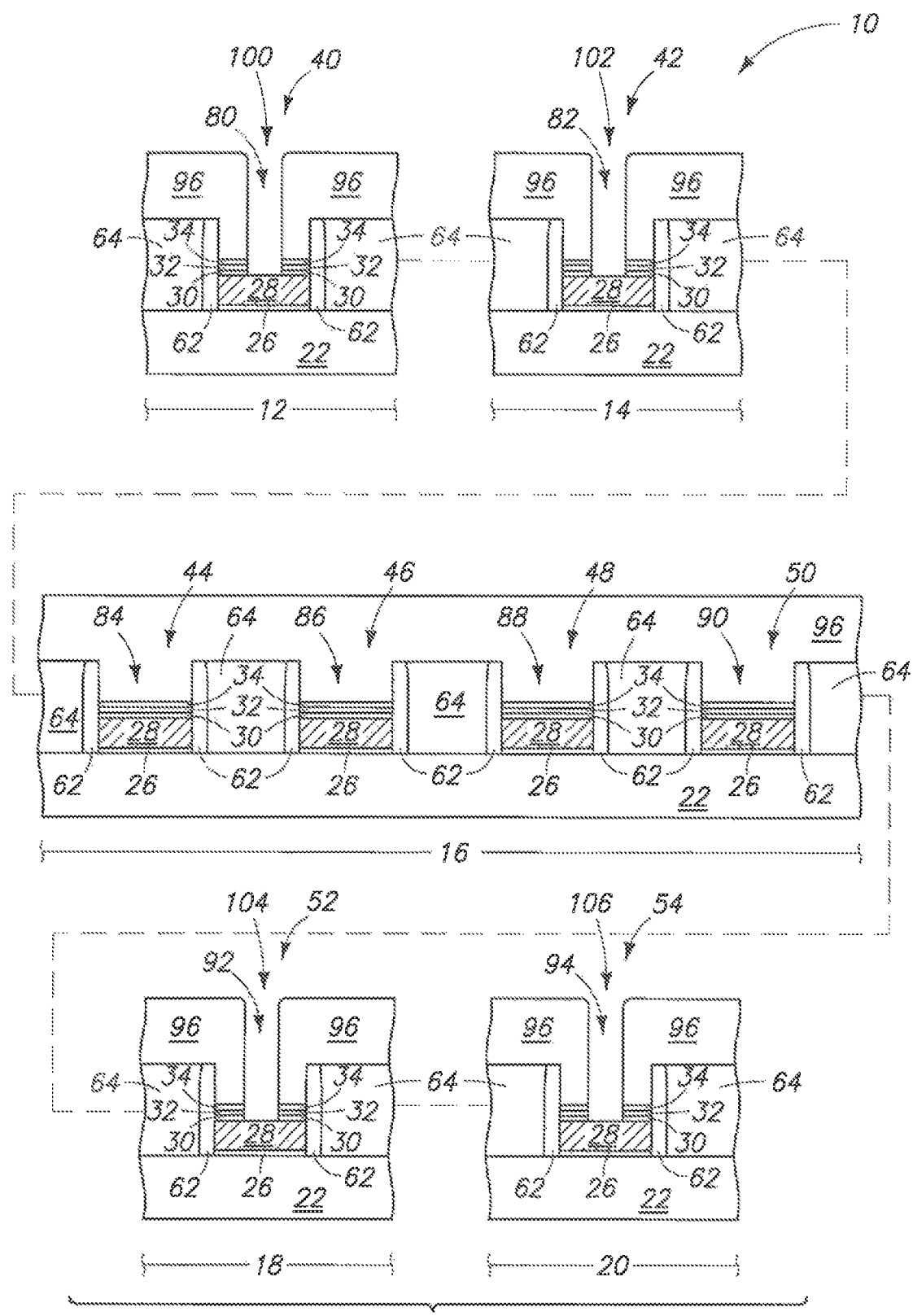

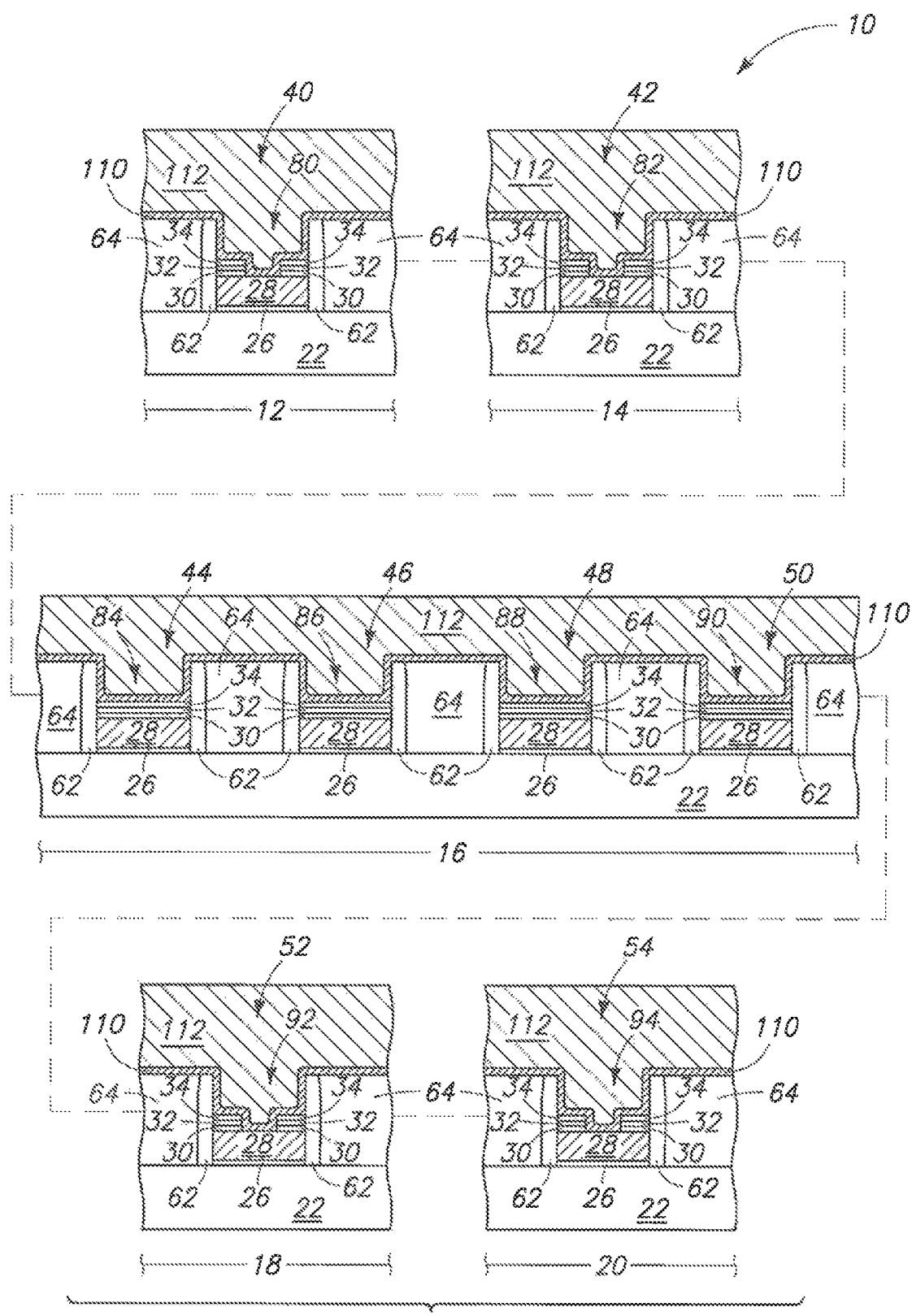

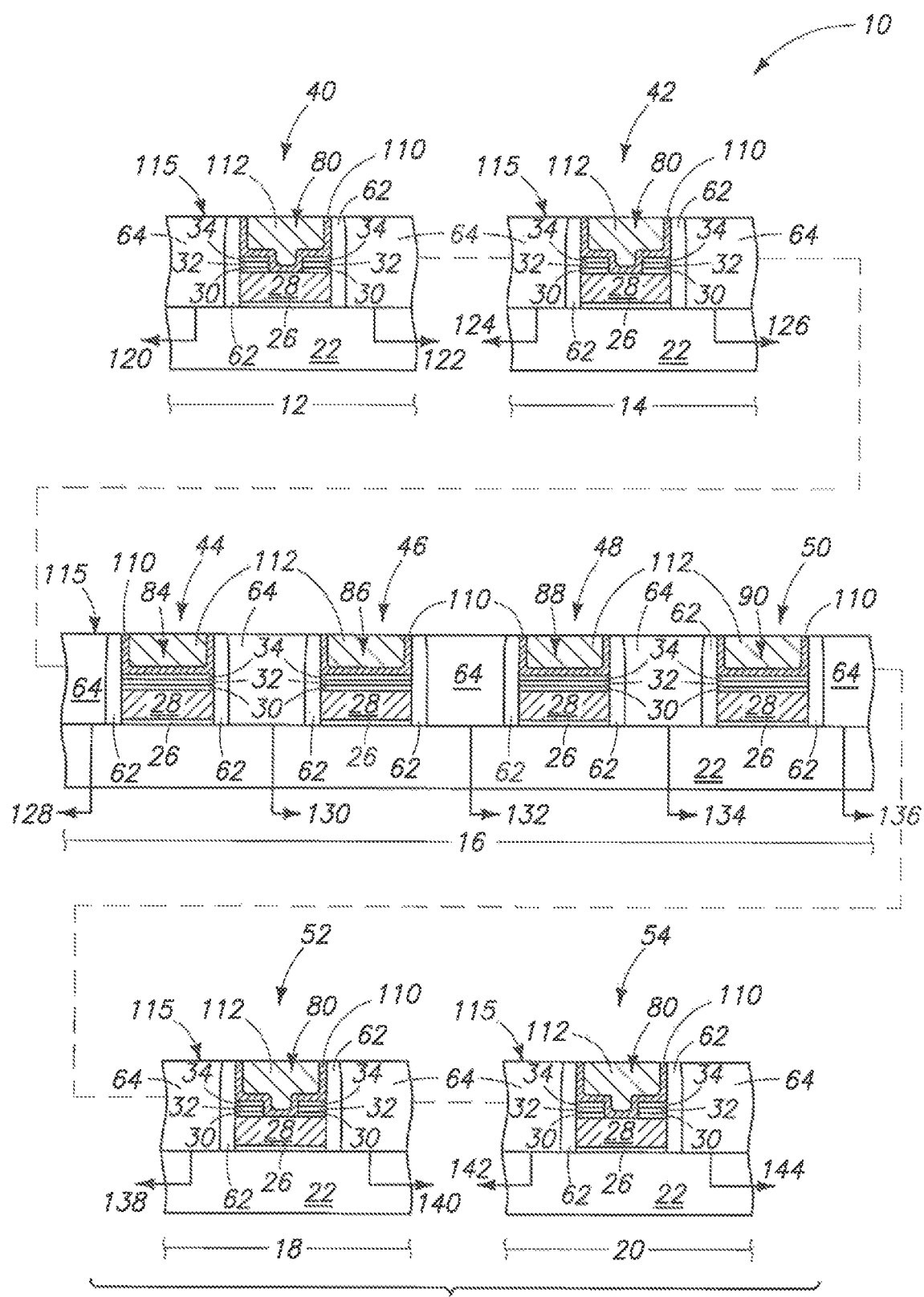

METHODS OF FORMING NAND CELL UNITS

RELATED PATENT DATA

This patent resulted from a continuation of U.S. patent application Ser. No. 16/548,003, filed Aug. 22, 2019, now U.S. Pat. No. 10,971,607; which was a continuation of and claims priority to U.S. patent application Ser. No. 15/967,457, filed Apr. 30, 2018, now U.S. Pat. No. 10,529,834; which was a divisional of and claims priority to U.S. patent application Ser. No. 15/207,275, filed Jul. 11, 2016, now U.S. Pat. No. 9,960,258; which was a divisional of and claims priority to U.S. patent application Ser. No. 14/225,053, filed Mar. 25, 2014, now U.S. Pat. No. 9,396,952; which was a divisional of and claims priority to U.S. patent application Ser. No. 13/605,848, filed Sep. 6, 2012, now U.S. Pat. No. 8,716,119; which was a divisional of and claims priority to U.S. patent application Ser. No. 12/986,487, filed Jan. 7, 2011, now U.S. Pat. No. 8,288,817; which was a divisional of and claims priority to U.S. patent application Ser. No. 12/128,404, filed May 28, 2008, now U.S. Pat. No. 7,867,844, the disclosures of which are all incorporated by reference herein.

TECHNICAL FIELD

Semiconductor constructions, methods of forming transistor gates, and methods of forming NAND cell units.

BACKGROUND

Memory devices provide data storage for electronic systems. One type of memory is a non-volatile memory known as flash memory. A flash memory is a type of EEPROM (electrically-erasable programmable read-only memory) that may be erased and reprogrammed in blocks. Many modern personal computers have BIOS stored on a flash memory chip. Such BIOS is sometimes called flash BIOS.

Flash memory is also popular in wireless electronic devices because it enables manufacturers to support new communication protocols as they become standardized, and to provide the ability to remotely upgrade the devices for enhanced features.

A typical flash memory comprises a memory array that includes a large number of memory cells arranged in row and column fashion. The cells are usually grouped into blocks. Each of the cells within a block may be electrically programmed by charging a floating gate. The charge may be removed from the floating gate by a block erase operation. Data is stored in a cell as charge in the floating gate.

NAND is a basic architecture of flash memory. A NAND cell unit comprises at least one select gate coupled in series to a serial combination of memory cells (with the serial combination being commonly referred to as a NAND string).

Flash memory, or more generally EEPROM, incorporate charge storage structures into transistor gates, and incorporate control gate structures over the charge storage structures. The charge storage structures may be immediately over gate dielectric. The charge storage structures may, for instance, comprise floating gate material or charge-trapping material. The amount of charge stored in the charge storage structures determines a programming state. In contrast, standard field effect transistors (FETs) do not utilize charge storage structures as part of the transistors, but instead have a conductive gate directly over gate dielectric material. EEPROM, such as flash, may be referred to as charge storage transistors to indicate that charge storage structures are incorporated into the transistors. The gates of the charge storage transistors may be referred to as charge storage transistor gates.

It is desired to form the select gates to be standard field effect transistors (FETs), rather than charge storage transistors, and to form the string gates as charge storage transistors. Yet, it is also desired to utilize common processing steps for fabrication of the select gates and string gates. This is creating difficulties with conventional processing, and accordingly it is desired to develop new processing for fabrication of the select gates and string gates. Also, numerous peripheral gates may be formed adjacent a NAND memory array and utilized for controlling reading and writing relative to the memory array. It would be desired to develop processing which utilized common process steps for fabrication of the peripheral gates, string gates and select gates.

Although charge storage transistors (i.e., EEPROM transistors) of NAND have traditionally utilized floating gate material (for instance, polycrystalline silicon) for retaining charge, there has been substantial interest in replacing the floating gate material with charge trapping material (for instance, silicon nitride and/or conductive nanodots). It would be desirable for the processing utilized for fabrication of string gates, select gates, and peripheral gates to be generally applicable for applications in which the string gates correspond to charge storage transistor gates utilizing floating gate material, as well as to applications in which the string gates correspond to charge storage transistor gates utilizing charge-trapping material.

BRIEF DESCRIPTION OF THE DRAWINGS

FIGS. 3-11 are diagrammatic, cross-sectional views of various portions of a semiconductor construction shown at various process stages of an embodiment.

DETAILED DESCRIPTION OF THE ILLUSTRATED EMBODIMENTS

Figure 1:
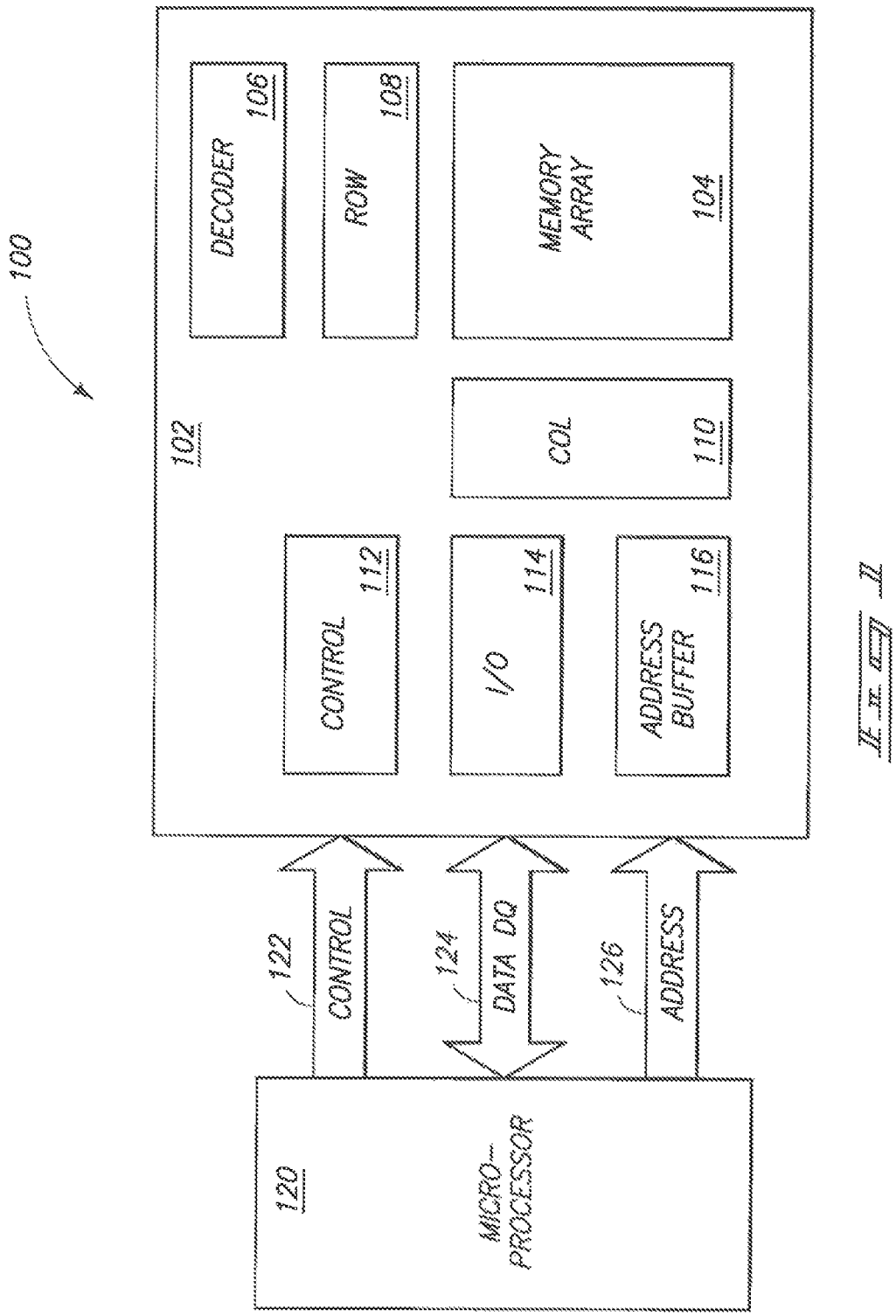
FIG. 1 is a simplified block diagram of a memory system in accordance with an embodiment.

FIG. 1 is a simplified block diagram of a memory system 100, according to an embodiment. Memory system 100 includes an integrated circuit flash memory device 102 (e.g., a NAND memory device), that includes an array of floating-gate memory cells 104, an address decoder 106, row access circuitry 108, column access circuitry 110, control circuitry 112, input/output (I/O) circuitry 114, and an address buffer 116. Memory system 100 includes an external microprocessor 120 electrically connected to memory device 102 for memory accessing as part of an electronic system. The memory device 102 receives control signals from the processor 120 over a control link 122. The memory cells are used to store data that is accessed via a data (DQ) link 124. Address signals are received via an address link 126, and are decoded at address decoder 106 to access the memory array 104. Address buffer circuit 116 latches the address signals. The memory cells may be accessed in response to the control signals and the address signals.

Figure 2:
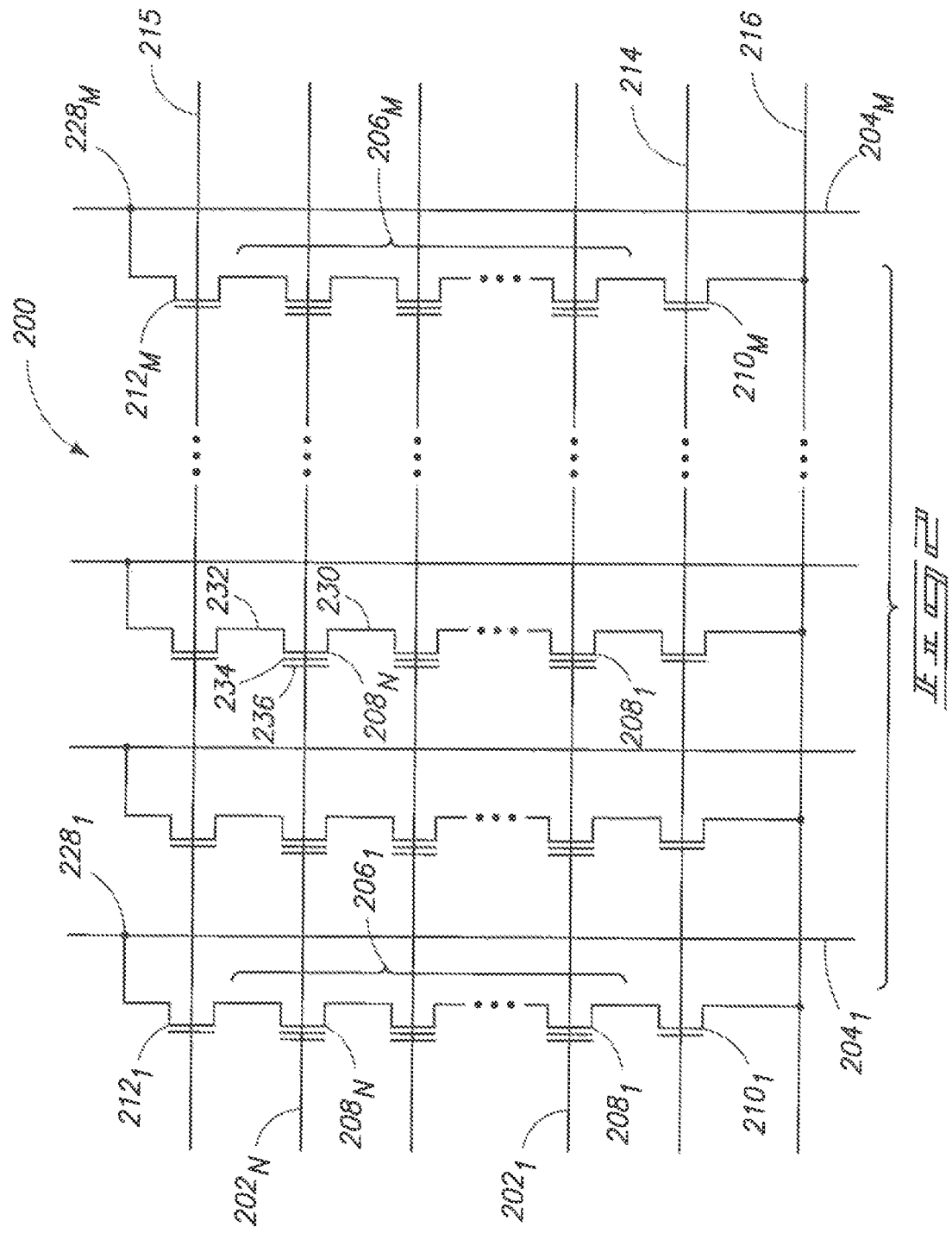
FIG. 2 is a schematic of a NAND memory array in accordance with an embodiment.

FIG. 2 is a schematic of a NAND memory array 200. Such may be a portion of memory array 104 of FIG. 1. Memory array 200 includes access lines (i.e., wordlines) $202_1$ to $202_N$, and intersecting local data lines (i.e., bitlines) $204_1$ to $204_M$. The number of wordlines 202 and the number of bitlines 204 may be each some power of two, for example, 64 wordlines and 64 bitlines. The local bitlines 204 may be coupled to global bitlines (not shown) in a many-to-one relationship.

Memory array 200 includes NAND strings $206_1$ to $206_M$. Each NAND string includes floating gate transistors $208_1$ to $208_N$. The floating gate transistors are located at intersections of wordlines 202 and a local bitlines 204. The floating gate transistors 208 represent non-volatile memory cells for storage of data, or in other words are comprised by flash transistor gates. The floating gate transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact 2281. The source of each drain select gate 212 is connected to the drain of the last floating-gate transistor 208 of the corresponding NAND string 206. For example, the source of drain select gate $212_1$ is connected to the drain of floating gate transistor $208_N$ of the corresponding NAND string $206_1$.

Floating gate transistors 208 (i.e., flash transistors 208) include a source 230 and a drain 232, a floating gate 234, and a control gate 236. Floating gate transistors 208 have their control gates 236 coupled to a wordline 202. A column of the floating gate transistors 208 are those NAND strings 206 coupled to a given local bitline 204. A row of the floating gate transistors 208 are those transistors commonly coupled to a given wordline 202.

Some embodiments include methods in which common steps are utilized during fabrication of gates of both charge storage transistors and standard FETs for integrated circuitry. Throughout this document, a distinction is made between FET gates and charge storage transistor gates. FET gates are gates in which there is not charge-trapping or electrically floating material between a controlled transistor gate and a channel region, and charge storage transistor gates are gates in which there is charge-trapping or electrically floating material between a controlled transistor gate and a channel. The distinction between FET gates and charge storage transistor gates is based on structural characteristics of the gates rather than operational characteristics. It is recognized that charge storage transistor gates (for instance, flash gates) may be operated identically to FET gates if the floating material of the charge storage transistor gates is appropriately charged, and that charge storage transistor gates are utilized as FET devices in some conventional applications. However, the charge storage transistor devices remain structurally distinguishable from standard FET devices, regardless of the operational similarity of some charge states of charge storage transistor devices to standard FET devices.

An example embodiment is described with reference to FIGS. 3-11.

Figure 3:
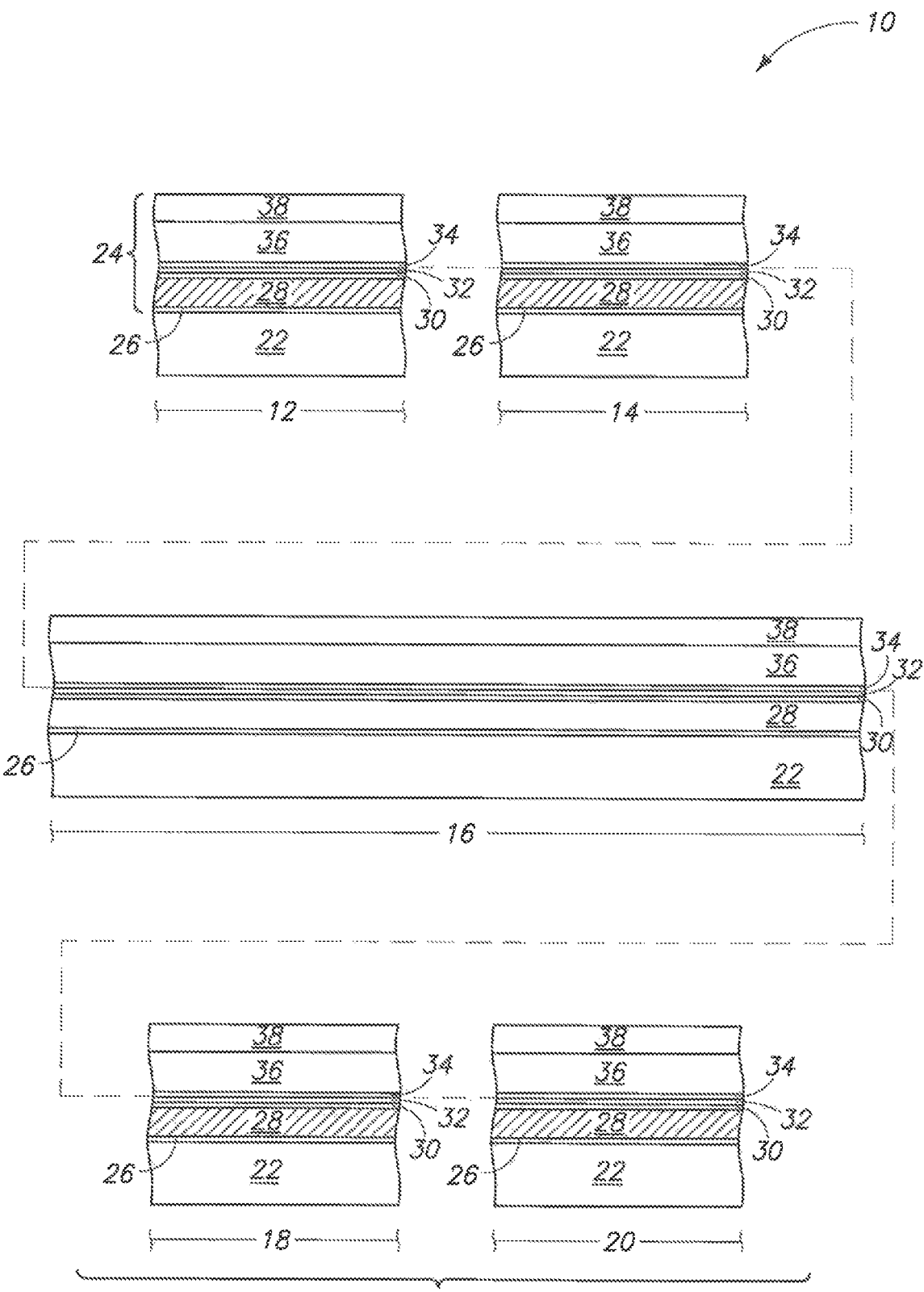

Referring initially to FIG. 3, several portions 12, 14, 16, 18 and 20 of a semiconductor construction 10 are illustrated. The portion 16 corresponds to a region where charge storage transistor gates (for instance, flash gates) are to be formed, and may, for example, correspond to the string gate region of a NAND cell unit (for instance, a region where one or more of the string gates of NAND string $206_1$ of FIG. 2 are to be formed). The portions 14 and 18 may correspond to regions where select gates are to be formed (for instance, the regions where select gates $210_1$ and $212_1$ of FIG. 2 are to be formed). The portions 12 and 20 may correspond to regions where peripheral circuitry (specifically, circuitry peripheral to a NAND memory array) is to be formed.

Semiconductor construction 10 comprises a substrate (i.e., base) 22. Substrate 22 may comprise, consist essentially of, or consist of, for example, monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and a semiconductive material layer (either alone or in assemblies comprising other materials). The term "substrate" refers to any supporting structure, including, but not limited to, the semiconductive substrates described above. Although substrate 22 is shown to be homogeneous, in some embodiments the substrate may comprise one or more layers or components associated with integrated circuitry that has been formed across a semiconductor base.

A stack 24 of various materials is formed over semiconductor substrate 22. The stack comprises, in ascending order from substrate 22, a gate dielectric material 26; a gate material 28; a plurality of dielectric materials 30, 32 and 34; a sacrificial material 36; and a protective material 38.

The gate dielectric material 26 may comprise any suitable composition or combination of compositions; and may, for example, comprise, consist essentially of, or consist of silicon dioxide. The gate dielectric material may be the same across all of the portions 12, 14, 16, 18 and 20, or may differ in one portion relative to another portion.

The gate material 28 may comprise any suitable composition or combination of compositions; and may, for example, comprise, consist essentially of, or consist of conductively-doped semiconductor material (for instance, conductively-doped silicon).

In some embodiments, the gate material may consist of conductively-doped silicon, and may have the same type of conductivity doping across all of the portions (or regions) 12, 14, 16, 18 and 20. Accordingly, the entirety of the gate material may be either n-type doped silicon or p-type doped silicon.

In other embodiments, the gate material may consist of conductively-doped silicon, and may have a different type of conductivity-enhancing dopant in one or more of the portions 12, 14, 16, 18 and 20 relative to another of the portions 12, 14, 16, 18 and 20. For instance, the gate material may consist of p-type doped silicon in the portion 16 where charge storage transistor gates (for instance, flash memory gates) are ultimately to be formed, and may consist of n-type doped silicon in one or more of the portions 12, 14, 18 and 20 where standard FET gates are to be formed.

In yet other embodiments, the gate material may comprise, consist essentially of, or consist of one or more charge-trapping compositions in the portion 16 where charge storage transistor gates are ultimately to be formed, and may consist of conductively-doped semiconductor material in the portions 12, 14, 18 and 20 where standard FET gates are ultimately to be formed.

If the gate material 28 is the same across an entirety of substrate 22, it may be referred to as a material blanket deposited across substrate 22. If the gate material comprises a different composition in one of the shown portions 12, 14, 16, 18 and 20 relative to another of the shown portions; the gate material in the one of the shown portions may be referred to as first gate material, and the gate material in the other of the shown portions may be referred to as second gate material. For instance, the gate material 28 of portion 16 may be a first gate material, while the gate material 28 of portions 12, 14, 18 and 20 may be a second gate material that is different in composition from the first gate material.

The electrically insulative materials 30, 32 and 34 may comprise any suitable composition or combination of compositions. In some embodiments, the materials 30, 32 and 34 may comprise, consist essentially of, or consist of one or more of silicon dioxide, hafnium oxide, aluminum oxide, zirconium oxide, hafnium aluminum oxide, hafnium silicon oxide, etc. Although three electrically insulative materials are shown formed directly over the gate material 28, in other embodiments there may be a different number of discrete electrically insulative materials formed directly over the gate material. Generally, there will be at least one electrically insulative material formed over the gate material. The electrically insulative materials that are directly over gate material 28 may be the same across all of the portions 12, 14, 16, 18 and 20, or may differ in one portion relative to another portion.

The sacrificial material 36 may comprise any suitable composition or combination of compositions, and may, for example, comprise, consist essentially of, or consist of silicon. In some embodiments, sacrificial material 36 may consist of one or both of amorphous and polycrystalline silicon; and may or may not be conductively-doped. In some embodiments, the gate material 28 and the sacrificial material 36 both comprise silicon. In such embodiments, the gate material may be referred to as a first silicon-containing material, and the sacrificial material may be referred to as a second silicon-containing material.

Protective material 38 may comprise any suitable composition or combination of compositions; and in some embodiments may comprise, consist essentially of, or consist of silicon dioxide. Protective material 38 may be formed by chemical vapor deposition utilizing tetraethylorthosilicate.

The stack 24 may be formed by any suitable method, including, for example, one or more of atomic layer deposition (ALD), chemical vapor deposition (CVD), and physical vapor deposition (PVD). Although all of the materials of the stack are shown comprising a uniform thickness across all of the portions 12, 14, 16, 18 and 20, the invention also includes embodiments in which one or more of the materials has a different thickness across some of the portions than across others of the portions. The embodiments in which one or more of the materials has a different thickness across some of the portions than across others of the portions may also be embodiments in which one or more of the materials comprises a different composition across some of the portions than across others of the portions.

Figure 4:
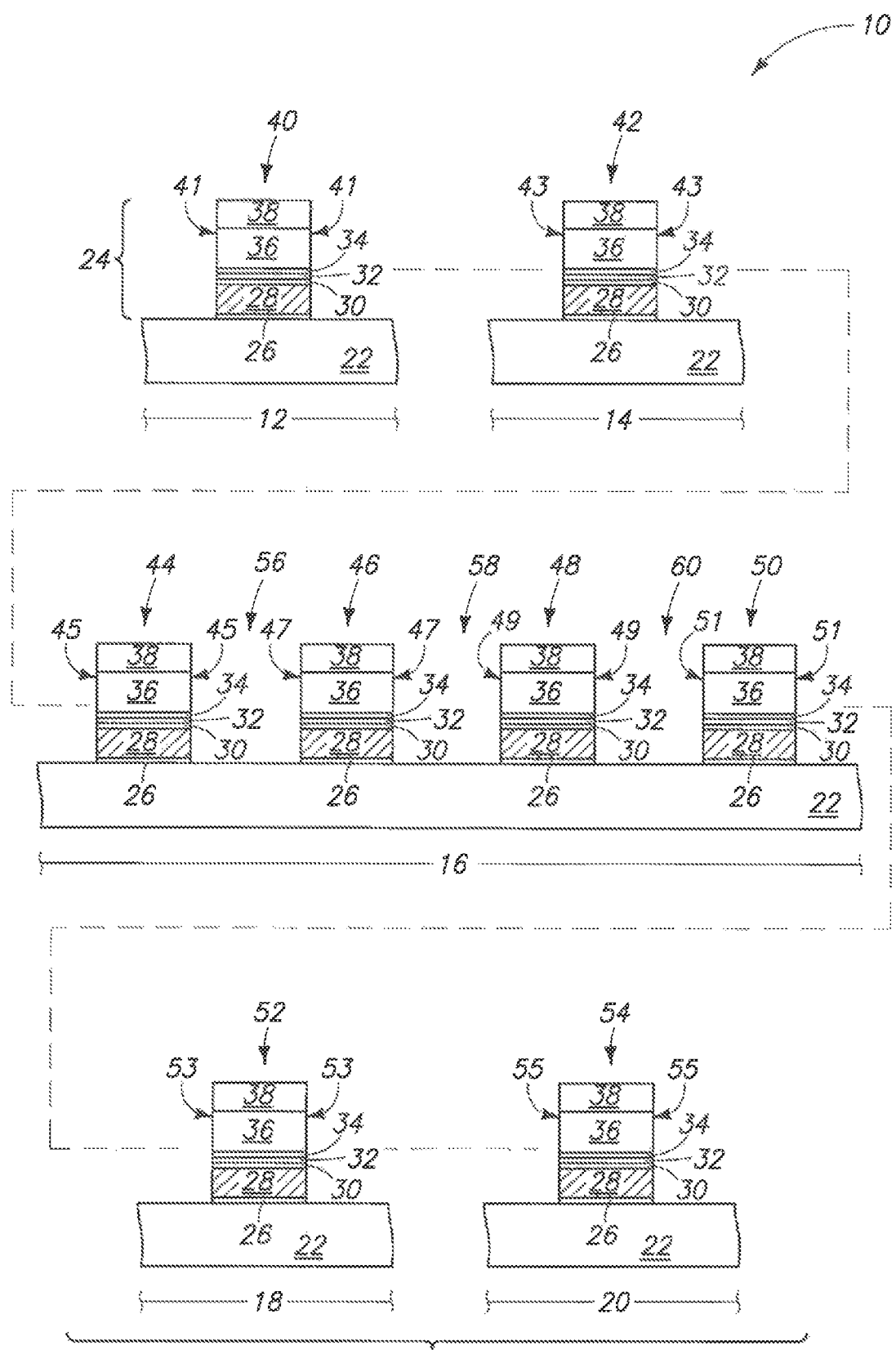

Referring to FIG. 4, stack 24 is patterned into a plurality of pillars 40, 42, 44, 46, 48, 50, 52 and 54. The pillars are spaced apart from one another, and gaps extend between the pillars. For instance, gaps 56, 58 and 60 are shown between adjacent pillars 44, 46, 48 and 50. The patterning of the gate stack into the pillars may be accomplished by any suitable processing. In an example embodiment, a photolithographically patterned mask (for instance, a photoresist mask) may be provided over the stack 24 to define locations of the pillars, the stack may then be etched to form the pillars, and subsequently the mask may be removed to leave the shown construction.

The pillars may be referred to as gate stacks, in that the pillars are ultimately utilized to form gates. Some of the pillars are ultimately utilized to form gates of charge storage transistors, while others are utilized to form gates of standard FETs. For instance, the pillars 44, 46, 48 and 50 across portion 16 may be utilized to form charge storage transistor gates, while the pillars 40, 42, 52 and 54 may be utilized to form standard FET gates. In such embodiments, the pillars 44, 46, 48 and 50 may be considered to be charge storage transistor gate stacks (for instance, flash gate stacks) at charge storage transistor gate locations (for instance, flash gate locations), while the pillars 40, 42, 52 and 54 may be considered to be standard FET gate stacks at gate locations of the standard FETs.

In some embodiments, the pillars 44, 46, 48 and 50 are utilized to form string gates of a NAND cell unit (for instance, the string gates of NAND string $206_1$ of FIG. 2), and the pillars 42 and 52 are utilized to form select gates of the NAND cell unit (for instance, the select gates $210_1$ and $212_1$ of FIG. 2). In such embodiments, the pillars 44, 46, 48 and 50 may be referred to as string gate stacks, while the pillars 42 and 52 are referred to as select gate stacks. Although four string gate stacks are shown, in other embodiments there may be other numbers of string gate stacks. In some embodiments, there will be at least two string gate stacks. Also, although two select gate stacks are shown, in other embodiments there may be other numbers of select gate stacks; and may be referred to as being at least one select gate stack.

The pillars 40, 42, 44, 46, 48, 50, 52 and 54 may be formed to have a common width as one another in some embodiments, and in other embodiments at least one of the pillars may have a different width than another pillar. For instance, the charge storage transistor gate stacks may be formed to have different widths than the standard FET gate stacks.

The pillars (i.e., gate stacks) 40, 42, 44, 46, 48, 50, 52 and 54 comprise sidewalls 41, 43, 45, 47, 49, 51, 53 and 55, respectively. The sidewalls define opposing sides of the pillars.

Figure 5:
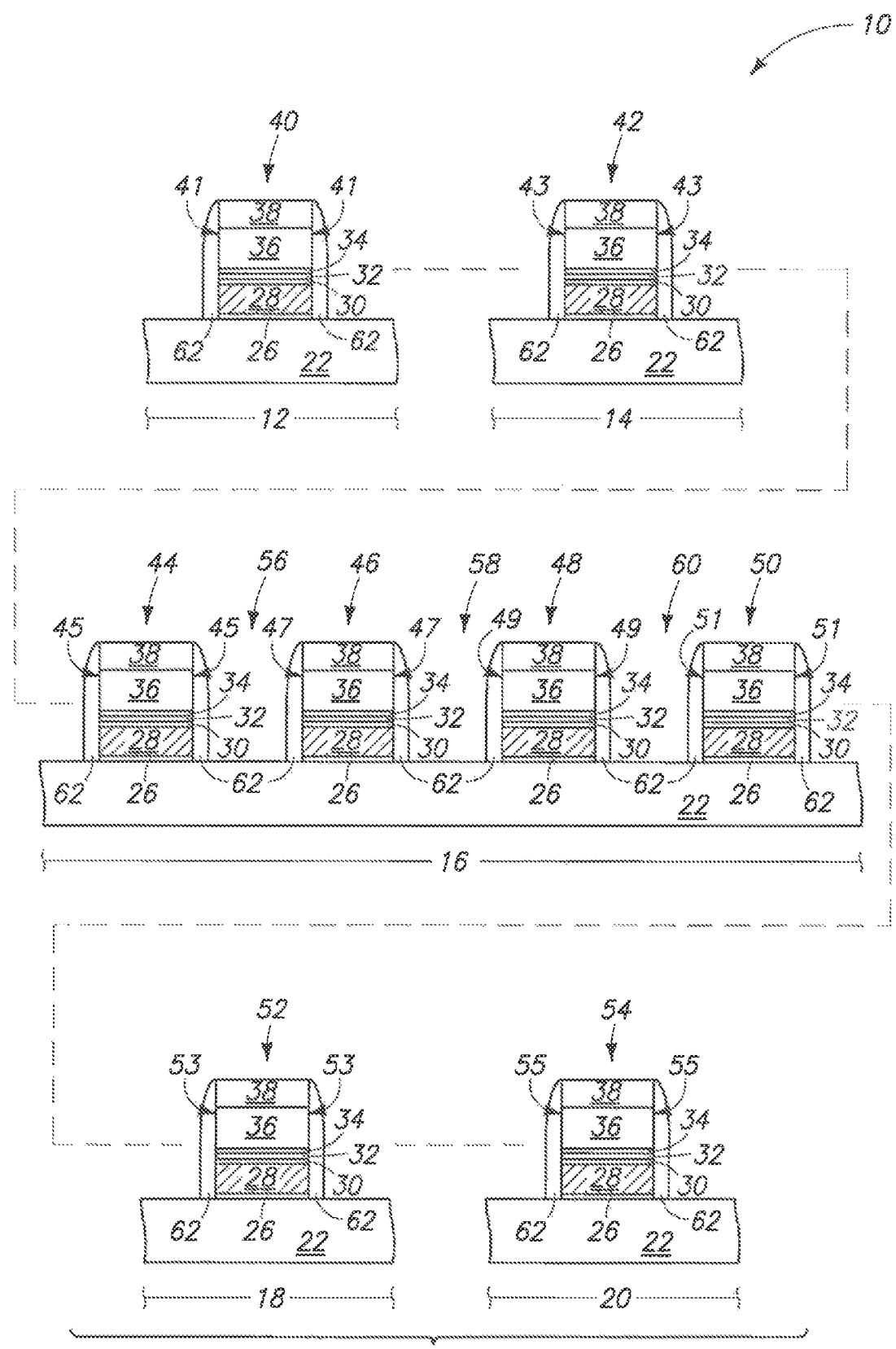

Referring to FIG. 5, spacers 62 are formed along the sidewalls 41, 43, 45, 47, 49, 51, 53 and 55. Spacers 62 may comprise electrically insulative material; and may, for example, comprise, consist essentially of, or consist of one or more of silicon dioxide, silicon nitride and silicon oxynitride. Spacers 62 may be formed by depositing a layer of spacer material across substrate 22, and conformally along sidewalls and tops of pillars 40, 42, 44, 46, 48, 50, 52 and 54; followed by an anisotropic etch of the spacer material to leave the shown spacers.

Referring to FIG. 6, electrically insulative material 64 is formed over pillars 40, 42, 44, 46, 48, 50, 52 and 54; and within the gaps (for instance, gaps 56, 58 and 60) between the pillars. Electrically insulative material 64 may comprise any suitable composition or combination of compositions; and may, for example, comprise, consist essentially of, or consist of one or more of silicon dioxide, borophosphosilicate glass (BPSG) and silicon nitride.

Referring to FIG. 7, construction 10 is subjected to planarization (for instance, chemical-mechanical polishing) to form a planarized upper surface 65 extending across material 64, spacers 62, and the sacrificial material 36 of pillars 40, 42, 46, 48, 50, 52 and 54. The planarization has removed upper portions of spacers 62, and has entirely removed the protective material 38 (FIG. 6).

Referring to FIG. 8, sacrificial material 36 (FIG. 7) is removed from all of the pillars 40, 42, 44, 46, 48, 50, 52 and 54 to form cavities (i.e., openings) 80, 82, 84, 86, 88, 90, 92 and 94 at the tops of the pillars. Each of the cavities is bounded by the electrically insulative material 34 along the bottom, and by the spacers 62 along the sides.

The removal of sacrificial material 36 (FIG. 7) may be accomplished utilizing an etch selective for the sacrificial material relative to spacers 62, insulative material 64 and material 34. For instance, if spacers 62, material 64 and material 34 comprise one or more of silicon dioxide, silicon nitride and silicon oxynitride, then sacrificial material 36 may comprise polycrystalline silicon (either doped or undoped), so that the sacrificial material may be selectively removed relative to spacers 62, material 64 and material 34. In embodiments in which the materials 28 and 36 are first and second silicon-containing materials, respectively, the removal of sacrificial material 36 may be referred to as removal of the second silicon-containing material.

The depths of cavities 80, 82, 84, 86, 88, 90, 92 and 94 may be tailored by controlling a thickness of the sacrificial material 36 (FIG. 7) that is ultimately removed to form the cavities. In some embodiments, the cavities will have a depth of at least about 50 angstroms.

Referring to FIG. 9, a masking material 96 is formed over construction 10. The masking material 96 is patterned so that it has openings extending therethrough within the cavities 80, 82, 92 and 94 associated with the standard FET gate stacks (specifically, associated with the pillars 40, 42, 52 and 54) while not having openings extending therethrough to the cavities associated with the charge storage transistor gate stacks (specifically, associated with the pillars 44, 46, 48 and 50). The openings extending through masking material 96 are labeled as 100, 102, 104 and 106 in FIG. 9.

Masking material 96 may comprise, for example, photolithographically-patterned photoresist. Alternatively, or additionally, masking material 96 may comprise a hard mask patterned utilizing photolithographically-patterned photoresist and one or more etches.

After formation and patterning of masking material 96, etching is utilized to extend the openings 100, 102, 104 and 106 through materials 30, 32 and 34 to expose the gate material 28 of the standard FET gate stacks (specifically, to expose the gate material 28 of the pillars 40, 42, 52 and 54).

In the shown embodiment, the openings 100, 102, 104 and 106 are narrower than the cavities 80, 82, 92 and 94, and accordingly only some regions of materials 30, 32 and 34 are removed from over pillars 40, 42, 52 and 54. In other embodiments (not shown) the openings 100, 102, 104 and 106 may be at least as wide as the cavities 80, 82, 92 and 94 so that all of the materials 30, 32 and 34 are removed from over pillars 40, 42, 52 and 54.

Referring to FIG. 10, masking material 96 (FIG. 9) is removed. The remaining cavities 80, 82, 92 and 94 of the standard FET gate stacks (specifically, the cavities associated with pillars 40, 42, 52 and 54) are bounded by spacers 62, by materials 30, 32 and 34, and by gate material 28.

In the shown embodiment, the cavities 80, 82, 92 and 94 of FIG. 10 extend along and through remaining portions of materials 30, 32 and 34. In contrast, the cavities 84, 86, 88 and 90 of the charge storage transistor gate stacks (specifically, the cavities associated with pillars 44, 46, 48 and 50) do not extend through materials 30, 32 and 34. Thus, the electrically insulative materials 30, 32 and 34 of the standard FET gate stacks extend only partially across the gate material 28 of the standard FET gate stacks at the processing stage of FIG. 10, while the electrically insulative materials 30, 32 and 34 of the charge storage transistor gate stacks extend entirely across the gate material of the charge storage transistor gate stacks.

FIG. 10 shows a first conductive material 110 formed conformally within cavities 80, 82, 84, 86, 88, 90, 92 and 94 to partially fill the cavities and thereby narrow the cavities. The electrically conductive material 110 physically contacts the gate material 28 within cavities 80, 82, 92 and 94 of the standard FET gate stacks; and is spaced from the gate material 28 of the charge storage transistor gate stacks (specifically, the material 28 of the pillars 44, 46, 48 and 50) by the electrically insulative materials 30, 32 and 34. If material 28 is p-type doped polysilicon, the material 110 may be a metal with a high work function (with a "high work function" being at least about 4.6 electronvolts). For instance, material 110 may be titanium nitride and/or tantalum nitride deposited by one or both of ALD and CVD. Material 110 may have a thickness of from about 10 Å to about 150 Å; such as, for example, a thickness of from about 15 Å to about 50 Å. It may be preferred for the material 28 to be p-type doped in the charge storage transistors in embodiments in which the material 28 is conductively-doped semiconductor material. In contrast, either of n-type doped material or p-type doped material may be equally suitable for the material 28 of the standard FET transistors in embodiments in which the material 28 is conductively-doped semiconductor material.

A second electrically conductive material 112 is over the first electrically conductive material 110. The second electrically conductive material extends into the cavities narrowed by conductive material 110 and completely fills such narrowed cavities.

In some embodiments, the first and second conductive materials 110 and 112 comprise one or more metals. The first conductive material 110 may, for example, comprise a metal-containing composition; and in some embodiments may comprise, consist essentially of, or consist of metal nitride. For instance, first conductive material 110 may comprise, consist essentially of, or consist of one or both of tungsten nitride and tantalum nitride. The second conductive material 112 may comprise, consist essentially of, or consist of one or more metals and/or one or more metal-containing compositions. In an example embodiment, second electrically conductive material 112 may comprise, consist essentially of, or consist of tungsten.

Referring to FIG. 11, construction 10 is subjected to planarization (for instance, chemical-mechanical polishing) to form a planarized surface 115 extending across spacers 62, and materials 64, 110 and 112. The pillars 40, 42, 52 and 54 of FIG. 11 correspond to standard FET gates, and specifically have the upper conductive materials 110 and 112 shorted to the gate material 28. The pillars 44, 46, 48 and 50 correspond to charge storage transistor gates, and have the upper conductive materials 110 and 112 separated from gate material 28 by the electrically insulative materials 30, 32 and 34.

Source/drain regions 120, 122, 124, 126, 128, 130, 132, 134, 136, 138, 140, 142 and 144 are formed proximate the standard FET gates and the charge storage transistor gates to incorporate the gates into transistor constructions, as is diagrammatically illustrated in FIG. 11. The source/drain regions may be formed by implanting appropriate conductivity-enhancing dopant into semiconductor substrate 22. The source/drain regions may be formed at any suitable processing stage, and in some embodiments may be implanted at the processing stage of FIG. 5 so that the source/drain regions are self-aligned with the gates.

The cross-section of FIG. 11 may correspond to a plane through a NAND memory array (for instance, the array discussed above with reference to FIG. 2) and accordingly the shown standard FET gates and charge storage transistor gates may be along lines that extend into and out of the page relative to FIG. 11. The conductive materials 110 and 112 may form electrically conductive fins extending along such lines, and accordingly structures formed in accordance with some embodiments may be considered to be fin-type structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a NAND cell unit, comprising:
forming at least one select gate spaced from at least two string gates, the at least one select gate comprising a first gate material, a first electrically insulative material adjacent the first gate material, and a sacrificial material adjacent the first electrically insulative material; the string gates comprising a second gate material, a second electrically insulative material adjacent the second gate material, and the sacrificial material adjacent the second electrically insulative material;
removing the sacrificial material from the at least one select gate and from the string gates;
etching through the first electrically insulative material to the first gate material; and
after etching through the first electrically insulative material, forming a conductive material adjacent the at least one select gate and adjacent the string gates, the conductive material physically contacting the first gate material and being separated from the second gate material by the second electrically insulative material.

2. The method of claim 1 wherein the first and second gate materials consist of conductively-doped silicon, and wherein the conductive material comprises at least one metal.

3. The method of claim 1 wherein the first and second gate materials consist of conductively-doped silicon, wherein the second gate material consists of p-type doped silicon, wherein the conductive material comprises one or both of titanium nitride and tantalum nitride.

4. The method of claim 3 wherein the conductive material has a thickness of from about 10 Å to about 150 Å.

5. The method of claim 3 wherein the conductive material has a thickness of from about 15 Å to about 50 Å.

6. The method of claim 1 wherein:
the first gate material consists of conductively-doped silicon;
the second gate material comprises at least one charge-trapping composition; and
the conductive material comprises at least one metal.

7. The method of claim 1 wherein the first and second gate materials are compositionally different from one another.

8. The method of claim 1 wherein the first and second electrically insulative materials are compositionally the same as one another.

9. The method of claim 1 wherein the forming the at least one select gate comprises forming a plurality of discrete layers of insulative material adjacent the first gate material.

10. The method of claim 1 wherein the etching through the first electrically insulative material comprises leaving the second electrically insulative material entirely intact.

11. The method of claim 1 wherein the etching through the first electrically insulative material leaves portions of the first electrically insulative material adjacent the first gate material.

12. The method of claim 1 wherein the forming of the conductive material comprises the conductive material being directly against the second electrically insulative material.

13. The method of claim 1 wherein the first electrically insulative material comprises a plurality of insulative layers.

14. The method of claim 1 wherein the second electrically insulative material comprises a plurality of insulative layers.

15. The method of claim 1 wherein the sacrificial material comprises one or both of amorphous and polycrystalline silicon.

16. The method of claim 1 wherein the sacrificial material may or may not be conductively-doped.

17. A method of forming a NAND cell unit, comprising:
forming a select gate spaced from a string gate, the select gate comprising a first gate material and a plurality of first electrically insulative layers adjacent the first gate material; the string gate comprising a second gate material and a plurality of second electrically insulative layers adjacent the second gate material;
etching through the plurality of the first electrically insulative layers to the first gate material while leaving portions of the plurality of the first electrically insulative layers adjacent the first gate material; and
after etching through the plurality of the first electrically insulative layers, forming a conductive material adjacent the select gate and adjacent the string gate.

18. The method of claim 17 wherein the etching comprises leaving an entirety of the plurality of the second electrically insulative layers adjacent the second gate material.

19. The method of claim 17 wherein the plurality of the second electrically insulative layers comprises at least three discrete layers.

20. The method of claim 17 wherein the forming of the conductive material comprises forming a first conductive layer having a first thickness and a second conductive layer over the first conductive layer, the second conductive layer having a second thickness greater than the first thickness.

* * * * *